United States Patent [19]
Nakamura et al.

[11] Patent Number: 5,289,114
[45] Date of Patent: Feb. 22, 1994

[54] VOLTAGE DETECTION APPARATUS USING SHORT PULSE LIGHT SOURCE WITH NARROW SPECTRAL BAND WIDTH

[75] Inventors: Takuya Nakamura; Shinichiro Aoshima; Yutaka Tsuchiya, all of Hamamatsu, Japan

[73] Assignee: Hamamatsu Photonics K.K., Shizuoka, Japan

[21] Appl. No.: 713,215

[22] Filed: Jun. 11, 1991

[30] Foreign Application Priority Data

Jun. 28, 1990 [JP] Japan ................................. 2-171275

[51] Int. Cl.⁵ ............................................ G01R 31/00
[52] U.S. Cl. ................................. 324/96; 324/158 R
[58] Field of Search .................... 324/96, 73.1, 158 R, 324/158 D, 77 K, 76.36; 356/364, 367, 368; 372/22, 25, 33, 27, 102, 103; 359/245, 249

[56] References Cited

U.S. PATENT DOCUMENTS

| | | | |
|---|---|---|---|
| 3,720,884 | 3/1973 | Kelley et al. | 372/25 |
| 3,774,121 | 11/1973 | Ashkin et al. | 372/102 |
| 4,554,666 | 11/1985 | Altman | 372/102 |
| 4,655,547 | 4/1987 | Heritage et al. | 350/96.1 |
| 4,985,898 | 1/1991 | Furuya et al. | 372/102 |
| 4,996,475 | 2/1991 | Takahashi et al. | 324/96 |

FOREIGN PATENT DOCUMENTS

| | | |
|---|---|---|
| 0218449 | 4/1987 | European Pat. Off. . |
| 218499 | 2/1985 | Fed. Rep. of Germany . |
| 0218499 | 2/1985 | German Democratic Rep. ... 372/25 |
| 2209598 | 5/1989 | United Kingdom . |

OTHER PUBLICATIONS

Optics Letters, vol. 15, No. 3, FEb. 1, 1990 "Compression of Picosecond Pulses from Diode Lasers Using a Modified Grating-Pair Compressor" M. Kuznetsov et al. pp. 180–182.

Fork et al., "Negative Dispersion Using Pairs of Prisms," in *Optics Letters*, vol. 9, No. 5, May 1984, pp. 150–152.

Valdmanis et al., "Subpicosecond Electrooptic Sampling: Principles and Applications," in *IEE Journal of Quantum Electronics*, vol. QE-22, No. 1, Jan. 1986, pp. 69–78.

Silberberg et al., "Subpicosecond Pulses from a Mode-Locked Semiconductor Laser," in *IEE Journal of Quantum Electronics*, vol. QE-22, No. 6, Jun. 1986, pp. 759–761.

Aoshima et al., "Non-Contact Picosecond Electro-Optic Sampling Utilizing Semiconductor Laser Pulses," in *Ultrahigh Speed and High Speed Photography, Photonics, and Videography*, vol. 1155, Aug. 1989.

"Bandwidth-Limited Picosecond Pulse Generation in an Actively Mode-Locked GaAs Laser with Intracavity Chirp Compensation", J. Kuhl and M. Serenyi, Optics Letters, vol. 12, No. 5, May 1987, pp. 334–336.

"Picosecond Frequency Chirping and Dynamic Line Broadening in InGaAsp Injection Lasers Under Fast Excitation", Chinion Lin, Appl. Phys. Lett. 42(2), Jan. 15, 1983, pp. 141–143.

*Primary Examiner*—Vinh Nguyen
*Attorney, Agent, or Firm*—Sughrue, Mion, Zinn Macpeak & Seas

[57] ABSTRACT

A light source for emitting a pulsed laser beam having an ultrashort pulse width and a voltage detector including the light source therein. The light source includes a laser driving unit for driving the laser source to output the pulsed laser beam while the intensity of the pulsed laser beam is stabilized. A chirp compensator is also included to compensate for a chirp in the pulsed laser beam. A wavelength selector is used to extract light having a desired wavelength from the pulsed laser beam, thereby obtaining a pulsed laser beam having an ultrashort pulse width and a desired narrow spectral band width.

24 Claims, 11 Drawing Sheets

CW OSCILLATION

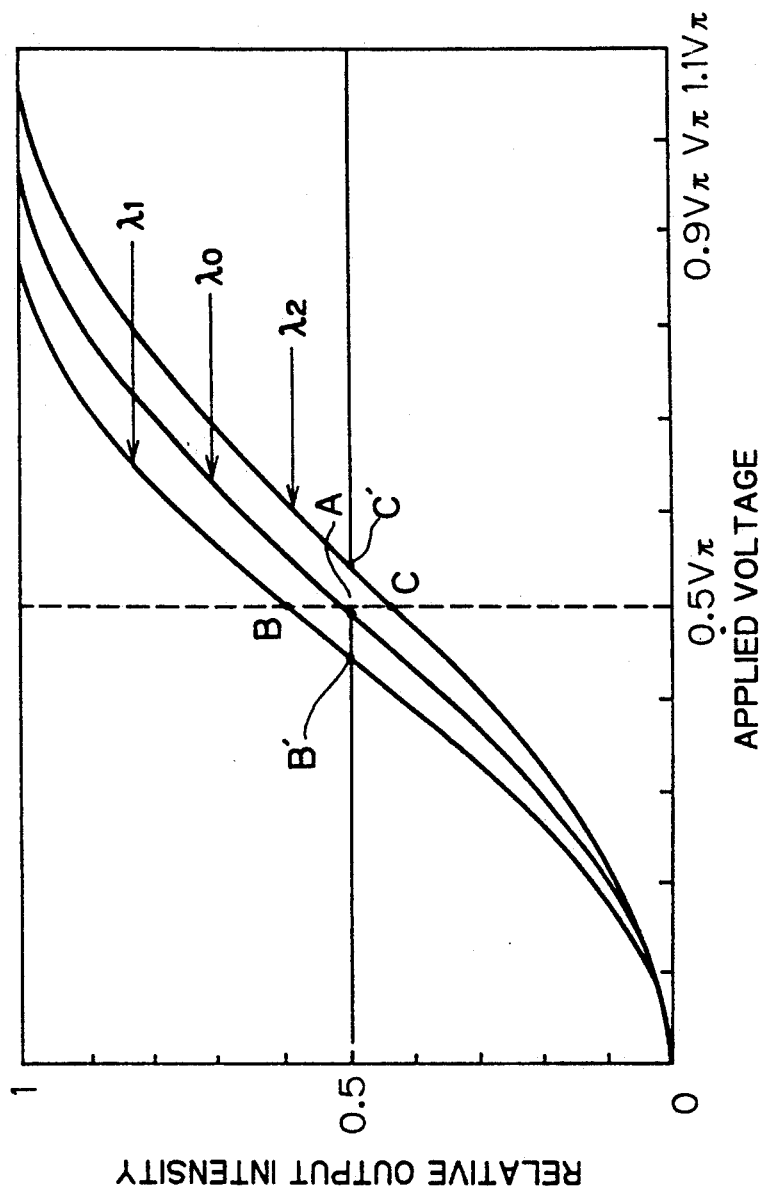

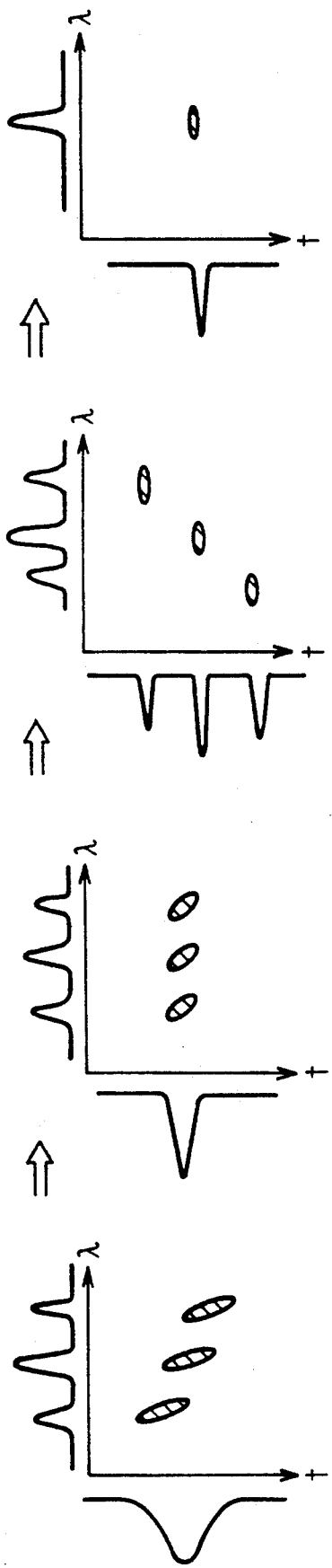
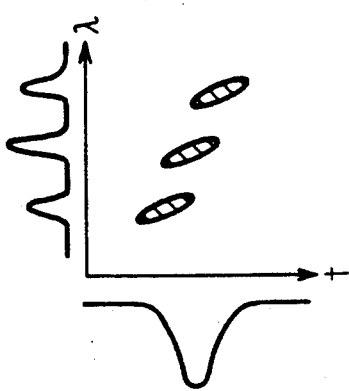
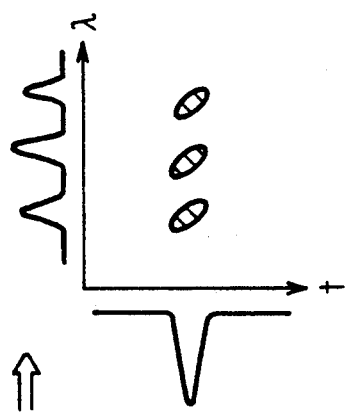
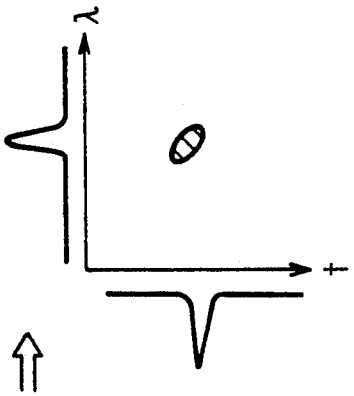

VOLTAGE DETECTION APPARATUS USING SHORT PULSE LIGHT SOURCE WITH NARROW SPECTRAL BAND WIDTH

BACKGROUND OF THE INVENTION

This invention relates to a light source for generating ultrashort optical pulses having a narrow spectral band width, and a voltage detection apparatus using the light source in which the optical pulses are utilized as sampling gates for measuring an ultrashort voltage variation.

In recent years, rapid progress has been made in the development of an electrooptic sampling technique for detecting repetitive ultrafast electrical transients at a higher time (temporal) resolution ranging from picoseconds to femto-seconds, which can not be detected by an electrically-measuring technique such as a sampling oscilloscope or the like. This electrooptic sampling technique is an electric field sensitive technique which utilizes ultrashort optical pulses as sampling gates (optical probe) to detect the ultrafast electrical transients in electronic devices such as field-effect transistors, photo-detectors and high-speed integrated circuits with high temporal and spatial resolution.

One device utilizing the above technique is known as an electrooptic sampling device in which optical pulses are used as sampling gates or probes to measure time-variation of an electrical signal flowing in an electrical element using an electrooptic (E-O) effect of an electrooptic (E-O) medium (crystal).

In this device, the E-O medium having a reflection surface is disposed approximately to the electrical element to be measured such that the reflection surface confronts the electrical element, and optical pulses which are irradiated to the E-O medium as an optical probe pulse, are passed through the E-O medium and reflected from the reflection surface to a photodetector. When the electrical signal having a voltage-waveform is applied to the electrical element, an electric field in a space which surrounds the electrical element is changed in accordance with the voltage-waveform of the electrical signal. In this case, the E-O medium disposed in the space is electrooptically effected by the change of the electric field and thus the optical pulses which have been passed through and reflected from the E-O medium are optically changed in polarization in accordance with the change of the electric field (or the voltage-waveform of the electrical signal). Each of the optical pulses reflected from the E-O medium is inputted to an analyzer to convert change of polarization into change of intensity and then the change of intensity is detected by the photodetector, and light intensity thereof is integrated for a period corresponding to a pulse width to thereby output an integrated value every optical pulse. These integrated values for the optical pulses are two-dimensionally displayed in a time axis on a display, and a profile of the displayed integrated values with respect to the time axis represents a measured voltage-waveform of the electrical signal. This device is disclosed by Janis A. Valdmanis and G. Mourou, "Subpicosecond Electrooptic Sampling: Principles and Applications", IEEE Journal of Quantum Electronics, Vol. QE-22, No. 1, January 1986, pages 69–78).

Another type of device of measuring an electrical signal in non-contact fashion using ultrashort optical pulses is disclosed in Japanese Unexamined Published Patent Publications Nos. 63-300970 and 64-46659.

In these techniques, the time or temporal resolution of the device is determined by the convolution time of an optical sampling (probe) pulse and a traveling electrical signal (variable electric field) in an electrooptic medium. If the pulse width of the optical sampling pulse is remarkably narrower in comparison with the voltage-waveform of the electrical signal, the time or temporal resolution is improved. Further, if a repetitive frequency of the optical pulses at which the voltage-waveform of the electrical signal is detected by a train of the optical sampling (probe) pulses is more increased, a light amount of the optical sampling pulses per second to be used for a sampling operation is more increased. Therefore, the higher repetitive frequency of the optical pulses enables a signal-to-noise (S/N) ratio to be more improved and enables a measuring time to be shorter. Accordingly, there has been required optical pulses having a shorter pulse width (duration) and a higher repetitive frequency in these techniques.

In order to perform a measuring operation of an electrical signal with high time resolution, a dye laser for generating optical pulses whose pulse width (duration) ranges from picoseconds to femtoseconds is advantageous, but results in a large-size system. In view of this disadvantage of the dye laser, a small-size semiconductor laser has been proposed to be used as a pulse light source as in SPIE Vol. 1155, pages 499–510. At present, a practically usable pulse width (duration) of a ultrashort optical pulse emitted by semiconductor lasers ranges from picoseconds to 200 picoseconds.

On the other hand, a wavelength of the emitted optical pulse varies in accordance with a type of semiconductor laser, and is usually in the range of from 670 nm to 1.5 μm. If a second harmonic wave of the optical pulse emitted from the semiconductor laser is generated, then an optical pulse whose wavelength is up to 340 nm can be obtained. The repetition frequency of such an optical pulse is generally in the range of from 0.1 to 200 MHz, depending on an application field to which the optical pulse is used. Technically, it is possible to produce repetitive optical pulses in an ultrahigh frequency range of several hundred Hz to several GHz.

In the electrooptic sampling technique as described above, a Fabry-Perot type semiconductor laser in which a pair of reflection plates are disposed so as to be confronted with each other to develop an oscillation therebetween is used as a light source for generating optical pulses. When the semiconductor laser is energized for a pulse oscillation, the semiconductor laser is oscillated in multiple modes and an optical pulse generated by the semiconductor laser has a broader spectral waveform (in wavelength) as shown in FIG. 1(B), unlike a narrow spectral waveform of CW oscillation as shown in FIG. 1(A).

Upon application of such an optical pulse having the broader spectral waveform as shown in FIG. 1(B) to an optical modulator such as an electrooptic crystal, a voltage (halfwave voltage $V\pi$ or $V\lambda/2$) which is applied to the optical modulator to make a phase difference of between perpendicularly-polarized components of the optical pulse at an exit of the electrooptic crystal has various values. The voltage has no constant value because the optical pulse has a broad spectral band width and the halfwave voltage is different among lights of these wavelengths in the band. More specifically, in the case where an electrooptic crystal is used in an optical modulator, the halfwave voltage $V\pi$ of the optical modulator must be changed in accordance with the wavelength of light applied thereto. For example, a higher halfwave voltage must be used in a longer wavelength region of the spectral band and a lower halfwave voltage must be used in a shorter wavelength region of the spectral band.

As described above, the half-wavelength voltage $V\pi$ is changed in accordance with the wavelength of the incident light. The relationship between the applied voltage to the electrooptic crystal and the intensity of an output light of the light modulator also and varied in accordance with the wavelength. For example, as shown in FIG. 2, if the semiconductor laser oscillates in multiple modes and the produced light has a wide spectral band ranging from $\pi 1$ to $\pi 2$ with a central wavelength $\pi 0$ ($\pi 1 < \pi 0 < \pi 2$), then an optical characteristic of the optical modulator (that is, a relationship between an applied voltage and a relative output light intensity) is changed in accordance with the wavelength.

On the other hand, in the optical modulator as described above, an optical condition (state) which is obtained by applying a voltage to the electrooptic crystal of the optical modulator is also obtained by adjusting an optical system such as a phase compensator (not shown) which is further equipped to the optical modulator. Thus it is a practical manner to establish an optical condition corresponding to $V\pi/2$ as an operating point by the above optical adjustment in order to maximize a change in the output light intensity in response to a change in the applied voltage (that is, to use a steeper portion of the S-curved optical characteristic as shown in FIG. 2). However, even if the operating point is set at $V\pi/2$ (at a point A in FIG. 2) of the wavelength $\lambda Q$, the operating point is shifted to a point B for the wavelength $\lambda 1$ or to a point C for the wavelength $\lambda 2$, and it does not remain at $V\pi/2$ for the wavelength $\lambda 1$ or $\lambda 2$, i.e., deviates from points B', C'. Furthermore, in response to the change in the applied voltage, the output light intensity varies at different rates with the wavelengths $\lambda 1$, $\lambda 0$, $\lambda 2$. Accordingly, the electric signal applied to the light modulator is modulated in a different modulating manner every wavelength.

The same problem occurs when the output light of a semiconductor laser has a mode hopping or a wavelength shift due to a temperature change.

As shown in FIG. 1(B), an optical pulse emitted from the semiconductor laser has a Gaussian type of spectral waveform having the highest peak at the central portion in a spectral band on the time-average, but the spectral waveform of the optical pulse is changed instantaneously. For example, the wavelength of the highest peak is successively shifted to any position within the spectral band. This shift or change of the spectral waveform at instantaneous time is called "mode hopping". Further, the spectral waveform of the optical pulse is wholly shifted upwardly or downwardly with respect to the wavelength in accordance with the change of temperature. For example, the spectral wavelength is wholly shifted to a lower wavelength side as the temperature is decreased, while the spectral wavelength is wholly shifted to a higher wavelength side as the temperature is increased. This shift of the spectral wavelength is the wavelength shift due to temperature change.

Accordingly, even if an electric signal of the same waveform is applied, the change in the intensity of the output light of the optical modulator is different due to the mode hopping and/or the wavelength shift due to the temperature change. Since the electrooptic sampling technique measures the change of the applied voltage on the basis of the change in the output light intensity, the mode hopping or wavelength shift of the semiconductor laser results in noise, so that the voltage is prevented from being accurately measured and the accuracy for measurement is degraded due to the mode hopping and the wavelength shift. In case of using an optical pulse having a broad spectral band width, the difference in a propagating speed between the lights having different wavelengths within a dispersion medium such as an electrooptic crystal is expanded by the dispersive medium. As a result, the pulse duration of the optical pulse having these lights is further increased, and the time resolution upon measurement is lowered.

SUMMARY OF THE INVENTION

An object of this invention is to provide a light source capable of generating ultrashort optical pulses having a narrow spectral band width.

Another object of this invention is to provide a voltage detection apparatus using the light source in which the optical pulses are utilized as sampling gates for measuring an ultrafast voltage variation with high resolution and a noise due to the change in the intensity of output light is reduced.

In order to attain the above objects, according to one aspect of this invention, a light source according to this invention comprises a laser source for emitting a pulsed laser beam having an ultrashort pulse width, a laser driving unit for driving the laser source to output the pulsed laser beam while the intensity of the pulsed laser beam is stabilized, and a spectra-band width narrowing unit for narrowing a spectral band width of the pulsed laser beam with chirp compensation and wavelength selection to thereby convert the pulsed laser beam from said laser source into a pulsed laser beam having an ultrashort pulse width and a desired narrow spectral band width.

The spectral-band narrowing unit comprises a chirp compensator for compensating a chirp of the pulsed laser beam and a wavelength selector for extracting light having a desired wavelength from the pulsed laser beam.

In order to attain the above objects, according to another aspect of this invention, a voltage detection apparatus according to this invention includes a light source comprising a laser source for emitting a pulsed laser beam, a laser driving unit for driving said laser source to output the pulsed laser beam while an intensity of the pulsed laser beam is stabilized, and a spectral-band width narrowing unit for narrowing a spectral band width of the pulsed laser beam with chirp compensation and wavelength selection to thereby convert the pulsed laser beam from the laser source into a pulsed laser beam having an ultrashort pulse width and a desired narrow spectral band width, a light modulator having an electrooptic characteristic for passing the pulsed laser beam from said spectral-band width narrowing unit therethrough while an information on the change of the voltage applied to the object is electrooptically transmitted to the pulsed laser beam to output the pulsed laser beam having the information on the change of the voltage, and a photodetector for detecting the pulsed laser beam outputted from the electrooptic medium to obtain the information on the change of the voltage applied to the object.

The spectral-band width narrowing unit comprises a chirp compensator for compensating a chirp of the pulsed laser beam and a wavelength selector for extracting light having a desired wavelength from the pulsed laser beam.

In the light source as described above, the pulsed laser beam having ultrashort pulse width and a narrow spectral band width is controlled so as to be constant in intensity by the laser driving unit. Therefore, mode hopping and a wavelength shift, for example, in a semiconductor laser are depressed. Moreover, the chirp compensator is effective to compensate a dispersion of the output pulse laser beam, so that the short pulses with narrow spectral band width at the desired wavelength can be obtained, and the wavelength selector is used to select the wavelength and spectral band width.

If the light source is incorporated in a voltage detection apparatus using the electrooptic medium, a time resolution is increased by the pulsed laser beam having an ultrashort pulse width, fluctuation in the intensity of an output light of the light modulator is depressed by a narrow spectral band width, noise is lowered by the depressed fluctuation in the intensity of the output light of the light modulator, and a measurement is accurately carried out.

BRIEF DESCRIPTION OF THE DRAWINGS

FIG. 2 is a diagram for showing the relationship between an applied voltage and a relative output intensity of a semiconductor laser;

FIGS. 5(A) through 5(D) are diagrams for showing processes for a mode chirp compensation and a wavelength selection;

FIGS. 6(A) through 6(C) are diagrams for showing processes for an intermode chirp compensation and a wavelength selection;

DETAILED DESCRIPTION OF THE INVENTION

Preferred embodiments of this invention will be described with reference to the accompanying drawings.

Figure 1A:
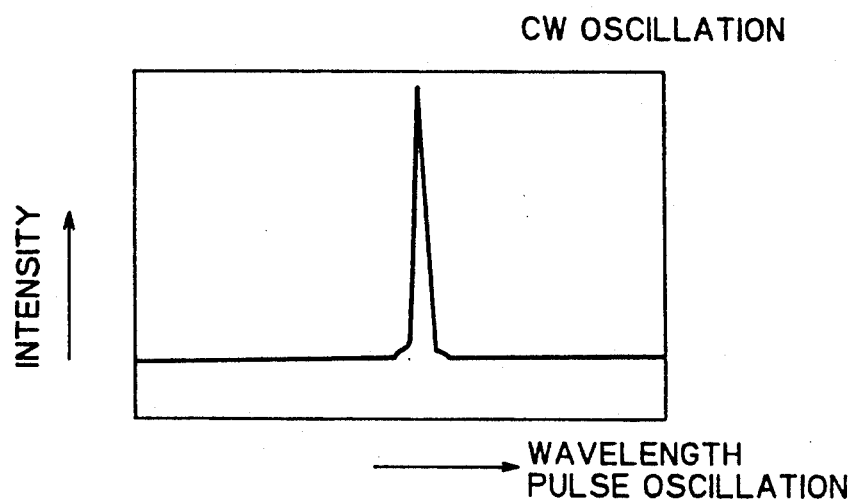
FIGS. 1(A) and 1(B) are diagrams for showing Cw oscillation and pulsed oscillation of a semiconductor laser, respectively.
Figure 1B:
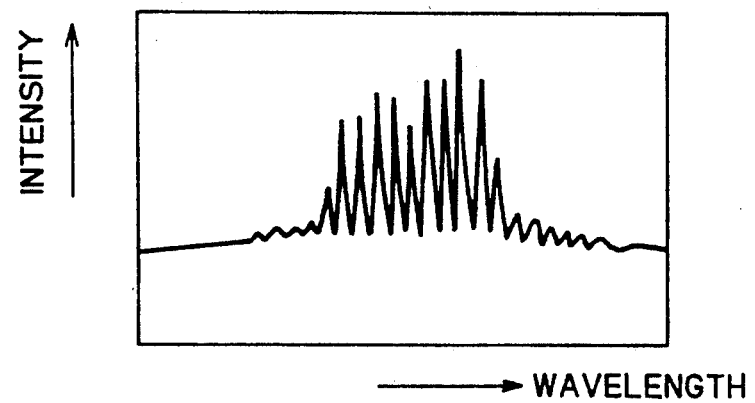
Figure 3:
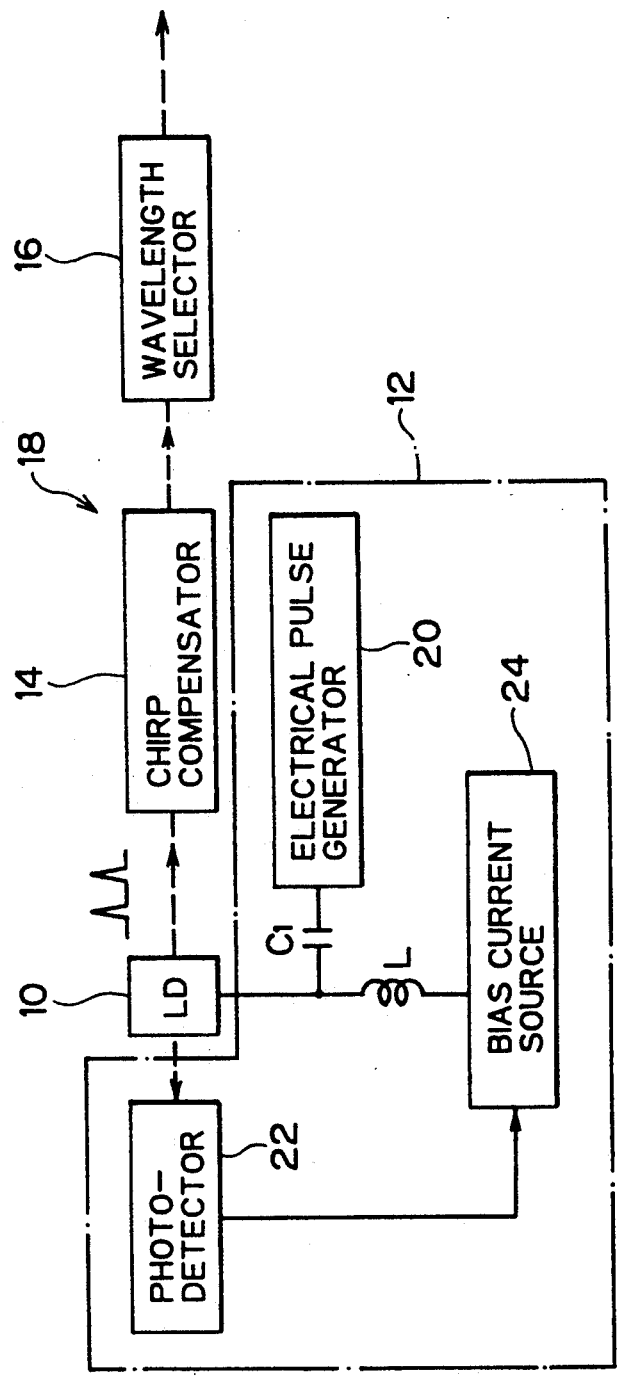
FIG. 3 is a block diagram of an embodiment of a light source embodiment of the present invention.

FIG. 3 is a block diagram of a light source according to an embodiment of the present invention. As shown in FIG. 3, a light source 18 according to this embodiment comprises a semiconductor laser (or laser diode) 10 for generating a train of ultrashort optical pulses, an output stabilizer 12 for driving the semiconductor laser 10 to output the stabilized optical pulses therefrom, a chirp compensator 14 for correcting chirp of the optical pulses emitted from the semiconductor laser 10, and a wavelength selector 16 for extracting light of a desired wavelength in a narrow spectral band width from the optical pulses which have been passed through the chirp compensator 14. The optical pulses thus obtained have an ultrashort pulse width (duration) and a narrow spectral band width, and are supplied to an optical modulator for an electrooptic measurement.

The output stabilizer 12 includes an electrical pulse generator 20 for generating a train of electric pulses and supplying them to the semiconductor laser 10 to perform a pulse oscillation with the supplied electric pulses. A photodetector 22 detects a part of the optical pulses generated in the semiconductor laser 10 and outputs an electrical signal representing the fluctuation of the optical pulses. A bias current source 24 supplies a bias current to the semiconductor laser 10 and modulates the bias current with the electrical signal from the photodetector 22 to thereby stabilize the intensity of the optical pulses emitted from the semiconductor laser 10. The electrical pulse generator 20 and the bias current source 24 are connected to the semiconductor laser 10 through a capacitor Cl and an inductance L, respectively. The inductance L is used to prevent the electrical pulse (having a high frequency) of the electric pulse generator 20 from being applied to the bias current source 24, and the capacitor Cl is used to prevent the bias current of the bias current source 24 from being applied to the electrical pulse generator 20.

A driving operation of the light source as shown in FIG. 3 will be described hereunder.

Both a bias current and a train of electric pulses are supplied to the semiconductor laser 10 from the bias current source 24 and the electrical pulse generator 20, respectively, thereby allowing the semiconductor laser 10 to commence an pulse oscillation and emit a train of optical pulses. A part of the optical pulses from the semiconductor laser 10 is detected by the photodetector 22, and an electrical signal representing an emission condition of the semiconductor laser 10 is applied from the photodetector 22 to the bias current source 24. The bias current source 24 modulates (increases or decreases) the bias current to be supplied to the semiconductor laser 10 in accordance with the input electrical signal to thereby stabilize the intensity of the optical pulses to be emitted from the semiconductor laser 10.

As described above, a semiconductor laser such as an ordinary Fabry-Perot type of semiconductor laser carries out a multi-mode oscillation to emit optical pulses each having a broad spectral band width in wavelength. Further, upon application of an electrical pulse from the electric pulse generator 20 to the semiconductor laser 10, refractive indexes of those elements which constitute a waveguide portion of the semiconductor laser 10 are instantaneously changed with a nonlinear effect due to the electric pulse. This instantaneous change of the refractive indexes causes lights having different wavelengths to be oscillated at different times in the semiconductor laser. As a result, lights having different wavelengths which constitute each optical pulse are emitted from the semiconductor laser 10 at different times. In general, light having a long wavelength is emitted at a later time than light having a short wavelength. This variation of an emission time among the lights of different wavelengths is referred to as "a chirp phenomenon".

Figure 4:
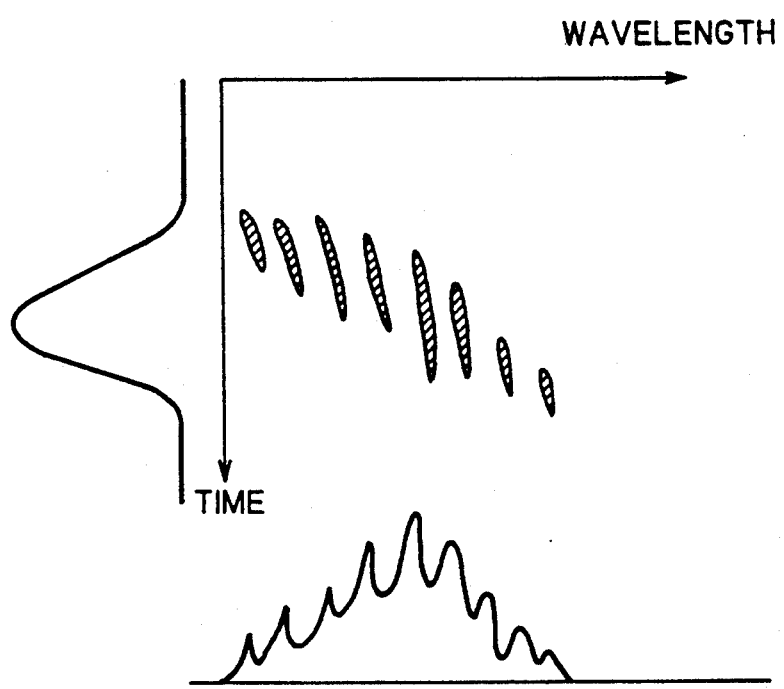
FIG. 4 is a diagram for showing the relationship between time and wavelength of output light from a semiconductor laser (a chirp phenomenon of a semiconductor)

FIG. 4 shows a relationship between the wavelength of emitted light and the emission time thereof in an optical pulse (a chirp phenomenon), which is observed using a time-resolution type spectroscope comprising a streak camera and a spectroscope (not shown). The abscissa and ordinate of FIG. 4 represent wavelength and time, respectively. In FIG. 4, a waveform at the lefthand side represents a relationship between an integrated intensity of the optical pulse and a time, and a waveform at the lower side represents a relationship between a time-integrated spectral waveform of the optical pulse and a wavelength.

As is apparent from FIG. 4, various modes of lights are produced in an optical pulse by a multimode oscillation in the semiconductor laser 10, and the lights of longer wavelength modes are oscillated with a longer time delay. In other words, as the wavelength of the light is more lengthened, an emission time of the light is more delayed. That is, the chirp phenomenon clearly occurs among the modes. In addition, the chirp phenomenon also occurs in each mode, in which the time-integrated intensity of each mode is inclined toward the longer wavelength region.

In order to compensate for the chirp phenomenon of the optical pulses from the semiconductor laser 10, the chirp compensator 14 is provided to the light source 18. The chirp compensator 14 has a dispersion characteristic for correcting the variation of the emission time of various lights having different wavelengths in each optical pulse. That is, light having a shorter wavelength propagates at a lower speed than light having a longer wavelength, and thus the light of shorter wavelength is emitted at a later time than the light of longer wavelength. Accordingly, when the multimode-oscillated optical pulse which contains lights having different wavelengths and different delayed (emission) times in accordance with wavelength, is passed through the chirp compensator 14, the chirp of the optical pulse is compensated by the dispersion characteristic of the chirp compensator 14. The optical pulse passed though the chirp compensator 14 is supplied to the wavelength selector 16 for selecting light of desired wavelength from the incident lights constituting the optical pulse.

FIGS. 5(A) to 5(D) show diagrams for a process in which a chirp in each mode is first compensated and then a chirp between the modes is compensated, and a process for selecting light of desired wavelength from the optical pulse which has been passed through the chirp compensator 14. These figures correspond to FIG. 4, in which a waveform at the lefthand side represents a relationship between an integrated intensity of the optical pulse and a time, and a waveform at the upper side represents a relationship between a time-integrated spectral waveform of the optical pulse and a wavelength. An optical pulse which is emitted from the semiconductor laser 10 and has a $\lambda - t$ relationship as shown in FIG. 5(A) is first subjected to chirp compensation in each mode ( hereinafter referred to as "mode chirp compensation"), so that the optical pulse as shown in FIG. 5(A) is intermediately converted into an optical pulse as shown in FIG. 5(B) and finally converted into an optical pulse as shown in FIG. 5(C). The optical pulse which has been compensated by the chirp compensator 14 is then passed through the wavelength selector 16 for wavelength extraction to obtain an ultrashort optical pulse having a desired narrow spectral band width as shown in FIG. 5(D).

In the process of forming ultrashort and narrow-spectral optical pulses as shown in FIGS. 5(A) through 5(D) as described above, the chirp of the optical pulse is compensated every mode, and thereafter a wavelength selection operation is carried out by the wavelength selector 16. However, as shown in FIGS. 6(A) through 6(C), a chirp compensation between modes (hereinafter referred to as "intermode chirp compensation") may be carried out to convert the optical pulse as shown in FIG. 6(A) into the optical pulse as shown in FIG. 6(B), and thereafter the wavelength selection may be carried out to obtain an optical pulse as shown in FIG. 6(C).

If it is desired to obtain an optical pulse having a shorter pulse width (duration), the mode chirp compensation is favorite. However, the intermode chirp compensation is more advantageous in that a dispersion amount of the chirp compensator 14 for the intermode chirp compensation may be smaller than that for the mode chirp compensation, and thus the chirp compensator 14 for the intermode chirp compensation may be miniaturized in size.

In the above embodiment, the optical pulse from the semiconductor laser 10 is first passed through the chirp compensator 14 and then applied to the wavelength selector 16. However, the optical pulse from the semiconductor laser 10 may be first passed through the wavelength selector 16, and then applied to the chirp compensator 14.

The chirp compensator 14 used in the above embodiment may be any construction insofar as propagating speeds of lights having different wavelengths are variable in accordance with the wavelength, particularly lights having longer wavelengths propagate at higher speed than lights having shorter wavelengths. For example, various elements such as an optical fiber 26 as shown in FIG. 7(A), a prism pair 28 as shown in FIG. 7(B), plural prism pairs 28 as shown in FIG. 7(C), a diffraction grating pair 30 as shown in FIG. 7(D) and plural diffraction pairs as shown in FIG. 7(E) may be uses as a chirp compensator.

Figure 7A:
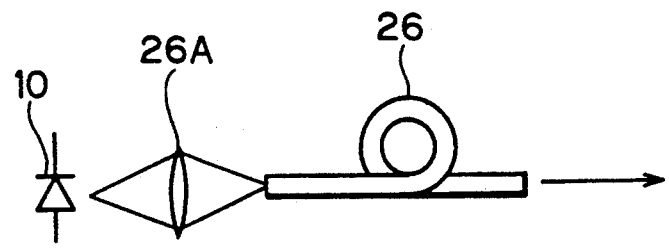
FIGS. 7(A) through 7(E) are schematic views for showing various optical arrangements of a chirp compensator used in the light source as shown in FIG. 3.

In the chirp compensator as shown in FIG. 7(A), the optical fiber 26 is formed of a material having a dispersive property and a lower loss to the incident lights thereto (for example, quartz or plastic fiber), and a dispersion amount for the chirp compensation is variable by adjusting the length of the optical fiber. A condensing lens 26A is disposed between the semiconductor laser 10 and the optical fiber 26 to focus the optical pulse emitted from the semiconductor laser 10 to one end portion of the optical fiber 26.

Figure 7B:
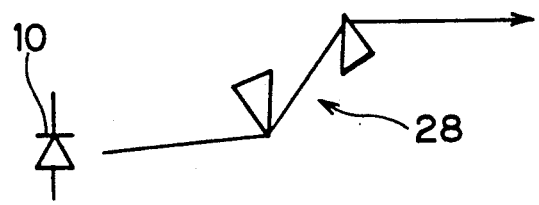
Figure 7C:
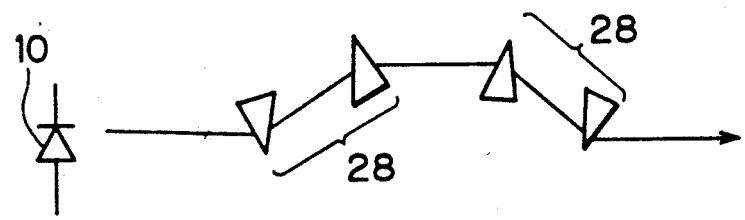

In the prism pairs 28 as shown in FIGS. 7(B) and 7(C), the dispersion amount for the chirp compensation can be finely adjusted by moving one of the prisms toward the vertex thereof. Even if the kind of the semiconductor laser 10 is changed, the dispersion amount can easily follow the change of the kind of the semiconductor laser 10. The reason why at least a pair of the prisms are used, resides in that light incident to a first prism is divergently passed through and emitted from the prism and then is collimated through a second prism disposed behind the first prism. In comparison with a case where a pair of prisms are used, a twofold dispersion effect can be obtained and spatial divergence of the optical pulse is more depressed when two pairs of prisms are used.

Figure 7D:
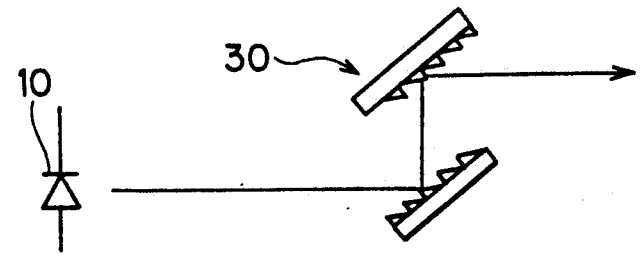
Figure 7E:
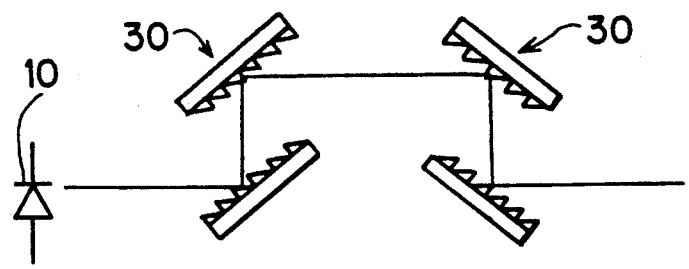

In the diffraction gratings as shown in FIGS. 7(D) and 7(E), an optical distance between the pair of the diffraction gratings 30 differs in accordance with the wavelength of incident light. Accordingly, the dispersion amount for the chirp compensation is adjusted by changing the distance between the diffraction gratings 30.

Figure 8A:
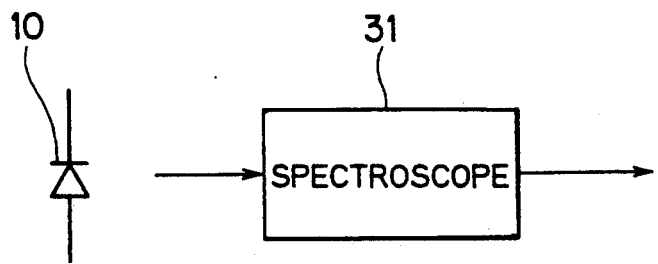
FIG. 8(A) through 8(C) are schematic views for showing various optical arrangements of a wavelength selector used in the light source as in FIG. 3.
Figure 8B:
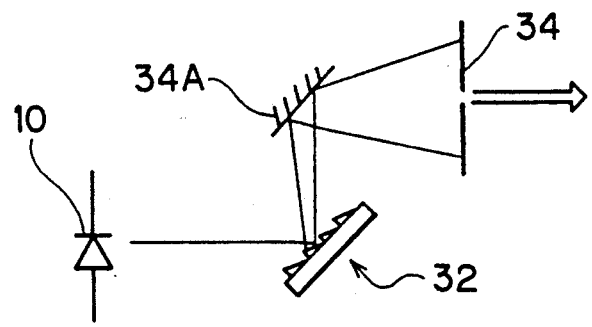
Figure 8C:
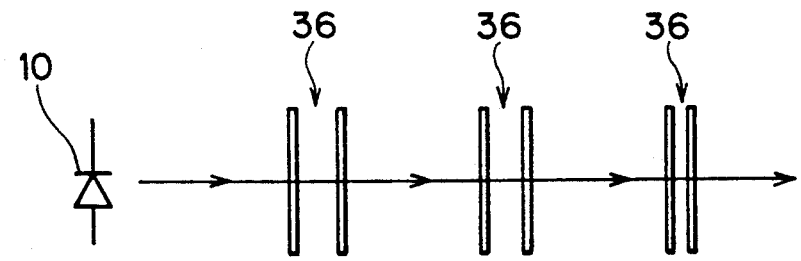

FIGS. 8(A) through 8(C) show embodiments of the wavelength selector 16.

In FIG. 8(A), a spectroscope 31 is used as a wavelength selector. The spectroscope 31 may comprise a prism, for example. In FIG. 8(B), combination of a diffraction grating 32 and a slit 34 is used as a wavelength selector. The optical pulse from the semiconductor laser 10 is reflected from the diffraction grating 32 at a different angle depending on the wavelength, and further reflected from a reflection plate such as a mirror 34A to the slit 34 in which a pulsed light of desired wavelength is extracted from the optical pulse. The light having the desired wavelength can be selected by adjusting the position of the slit 34, and a wavelength range to be extracted can be variable by changing an optical distance between the slit 34 and the diffraction grating 32 or a slit width of the slit 34.

In FIG. 8(C), combination of three Fabry-Perot etalons (plates) 36 is used as a wavelength selector. In this wavelength selector, plate-to-plate distances of the etalons are different from one another to improve wavelength-selective accuracy. This type of wavelength selector may comprise a single Fabry-Perot etalon or a plurality of Fabry-Perot etalons. In order to complete an arrangement of the light source according to this embodiment, one of the chirp compensators as shown in FIGS. 7(A) through 7(E) may be disposed in front of or behind of one of the wavelength selectors as shown in FIGS. 8(A) through 8(C).

Figure 9:
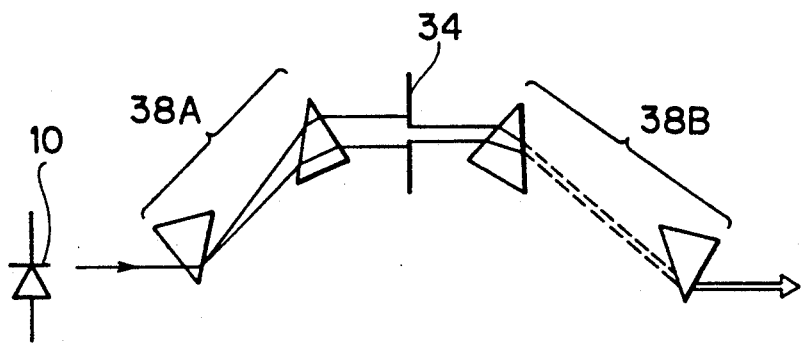
FIG. 9 is a schematic view of an optical arrangement of a combination of the chirp compensator and the wavelength selector.

FIG. 9 shows an embodiment of an arrangement capable of performing both of the chirp compensating and wavelength selection operations. The arrangement comprises two prism pairs 38A and 38B serving as a chirp compensator, and a slit 34 serving as a wavelength selector and disposed between the prism pairs 38A and 38B. More specifically, the slit 34 for the wavelength selection is disposed between the two prism pairs 38A, 38B for the chirp compensation which are of the same arrangement as shown in FIG. 7(C). The chirp compensation and the wavelength selector are thus of a combined construction.

Figure 10:
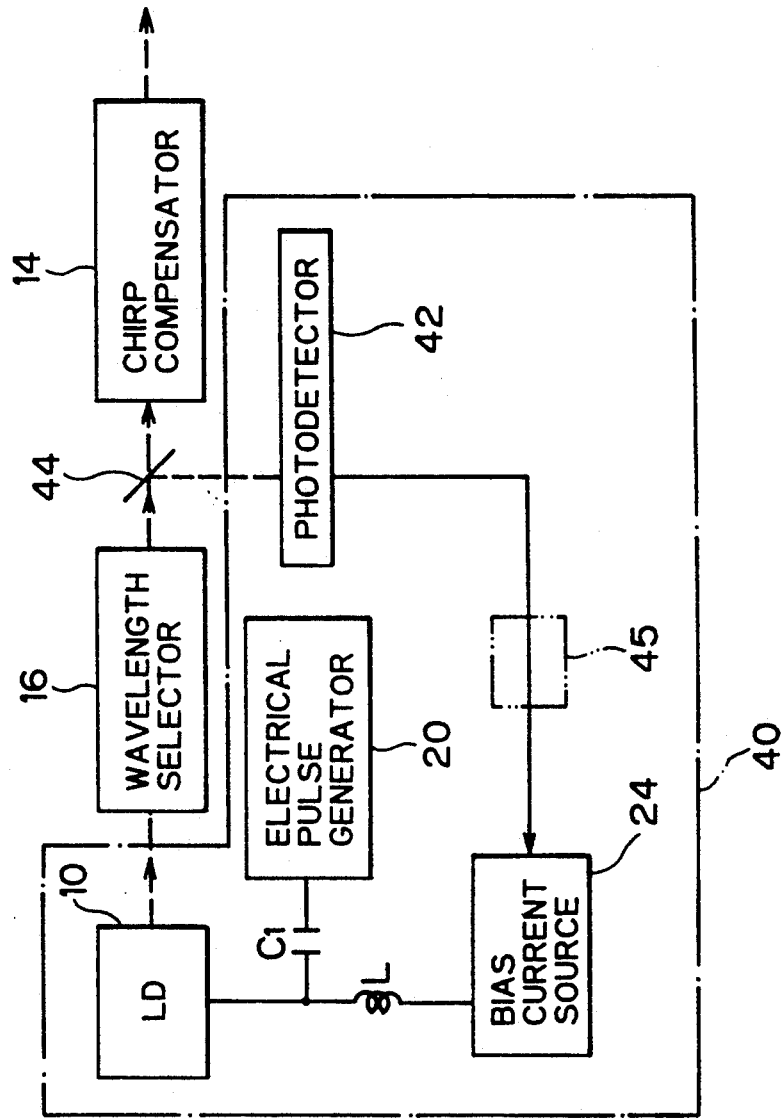
FIG. 10 is a block diagram of another embodiment of the light source of the present invention.

FIG. 10 shows a second embodiment of a light source for generating an ultrashort optical pulse having a narrow spectral band width.

In the second embodiment, a train of optical pulses from a semiconductor laser 10 are first passed through a wavelength selector 16 and then through a chirp compensator 14. An output stabilizer 40 includes a photodetector 42 for detecting a part of the optical pulse whose wavelength has been selected in the wavelength selector 16, and a bias current source 24 for supplying the semiconductor laser 10 with a bias current in accordance with a detected output signal from the photodetector 42 to thereby control the semiconductor laser 10 in such a manner that the intensity of the optical pulse having the desired wavelength is constant. The light having the desired wavelength which has been extracted in the wavelength selector 16 is spitted into two lights by a beam splitter 44, and one light is applied to the photodetector 42 of the output stabilizer 40. In addition, a corrector 45 for correcting the output signal from the photodetector 42 in accordance with a condition such as environmental temperature may be further added to the stabilizer 40 as indicated by the two-dot-and-dash lines in FIG. 10, to thereby further stabilize the optical pulse from the semiconductor laser 10. The other elements as shown in FIG. 10 are identical to those of the first embodiment of the present invention, and will not be described in detail.

Figure 11:
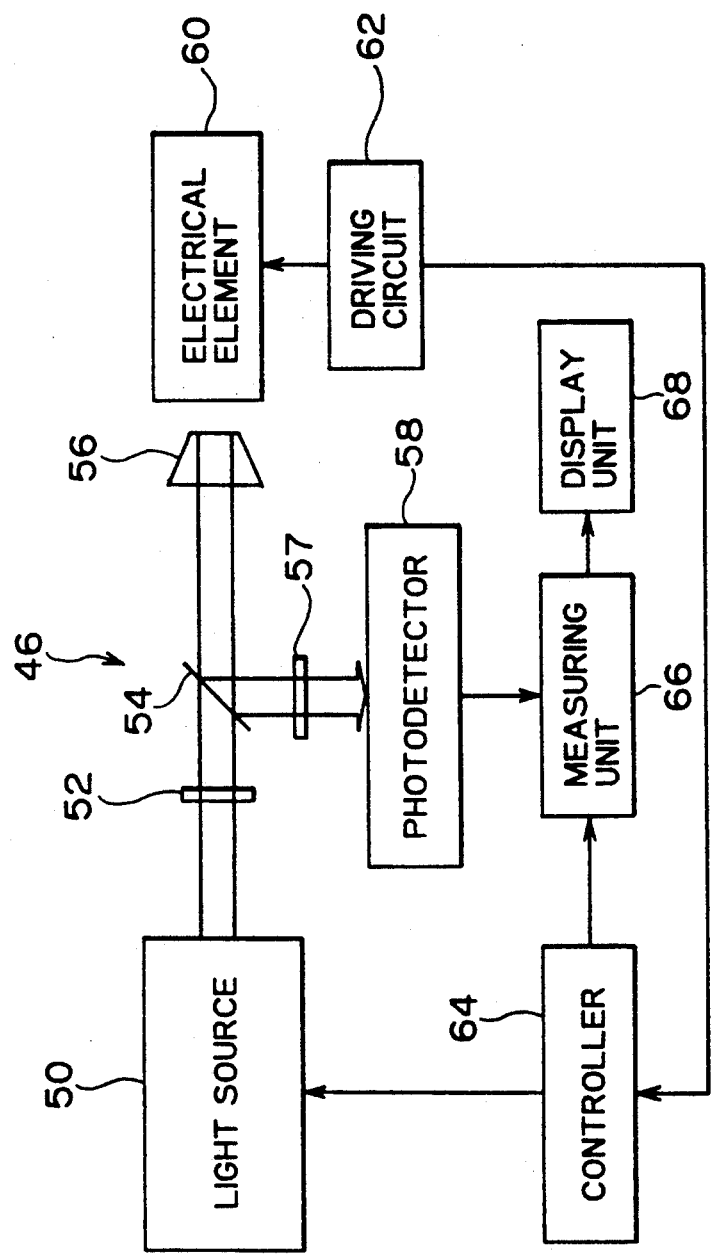
FIG. 11 is a block diagram of an embodiment of a voltage detection apparatus utilizing the light source of this invention.

FIG. 11 is a block diagram for an embodiment of a voltage detection apparatus 46 which utilizes as sampling gates optical pulses emitted from the light source 50 of the above embodiment to perform an electrooptic sampling measurement.

In FIG. 11, a train of ultrashort optical pulses having a desired wavelength which has been emitted from the light source 50 is applied through a polarizer 52 and a half mirror 54 to an electrooptic modulator (probe) 56 containing an electrooptic crystal. The optical pulses incident to the electrooptic modulator 56 are passed therethrough and reflected from the tip end of the electrooptic probe 56 while picking up information on a voltage waveform of an electrical element 60 to be measured, and then reflected from the half mirror 54 through an analyzer 57 to the photodetector 58.

The electrooptic probe 56 is constructed of an electrooptic material whose refractive index varies due to an electric field from the electrical element 60 to be measured. Depending on the change in the voltage (electric field) of the electrical element 60, the electrooptic probe 56 changes a polarized state of an incident linearly-polarized light. Therefore, a change in the voltage of the electrical element 60, that is, a voltage waveform applied to the electrical element 60 can be statistically measured while the reflected optical pulses whose polarized states have been changed in accordance with the change of the voltage are successively detected by the photodetector 58 through the analyzer 57.

The voltage detection apparatus 46 also includes a driving unit 62 for supplying an electrical signal having the voltage waveform to the electrical element 60 and also supplying the signal to a controller 64 which controls the driving of the light source 50, a measuring unit 66 for processing the output signal from the photodetector 58 in response to a signal from the controller 64 to thereby obtain a measured voltage waveform, and a display unit 68 for displaying the measured voltage waveform of the electrical element 60 on the basis of the processed data from the measuring unit 66.

As described above, since the optical pulses emitted from the light source 50 have an ultrashort pulse width, the voltage waveform of the electrical element 60 can be accurately detected with high time resolution.

Since the optical pulse has a narrow spectral band, the operating point of the electrooptic probe 56 is not shifted due to a broad wavelength band, and the intensity of the optical pulse from the electrooptic probe 56 is prevented from being changed due to the change in the wavelength of the optical pulse to be emitted from the semiconductor laser 10 which is caused by the mode hopping, the wavelength shift or the like. Accordingly, any noise due to changes in the intensity of the optical pulse is reduced and an accurate measurement of voltages (voltage waveforms) can be performed.

Figure 12:
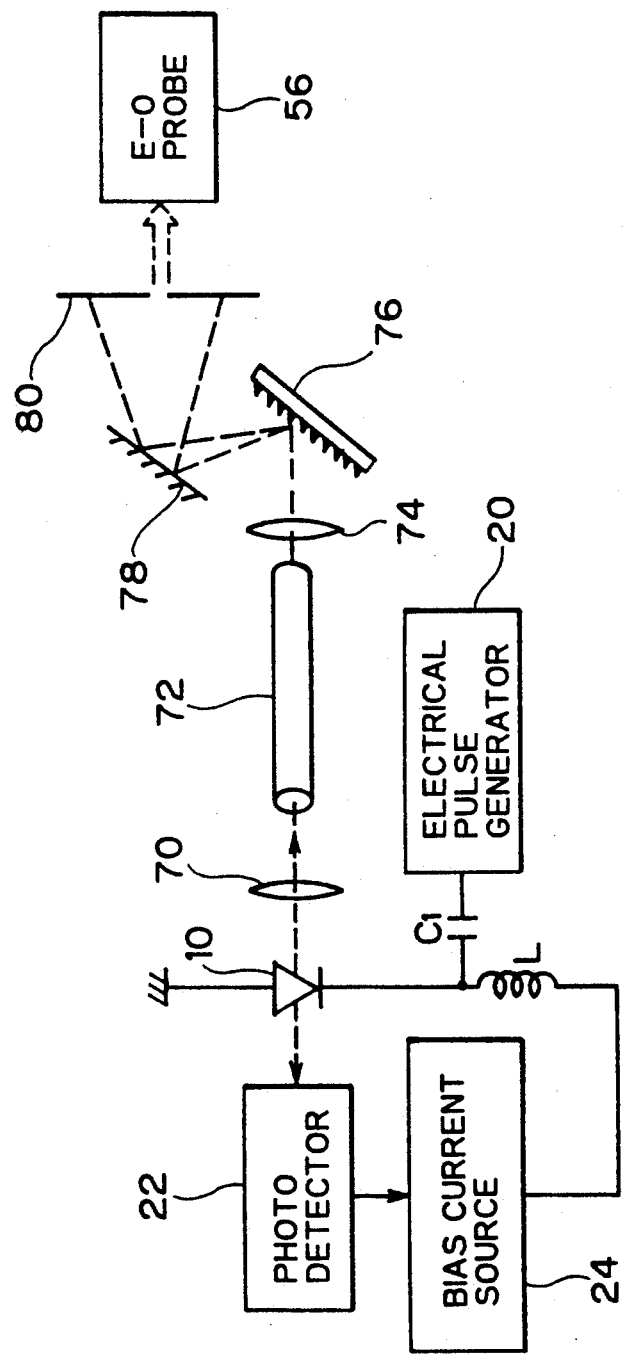
FIG. 12 is a block diagram of the voltage detection apparatus utilizing the light source including the chirp compensator as shown in FIG. 7(A) and the wavelength selector as shown in FIG. 8(B)
Figure 13:
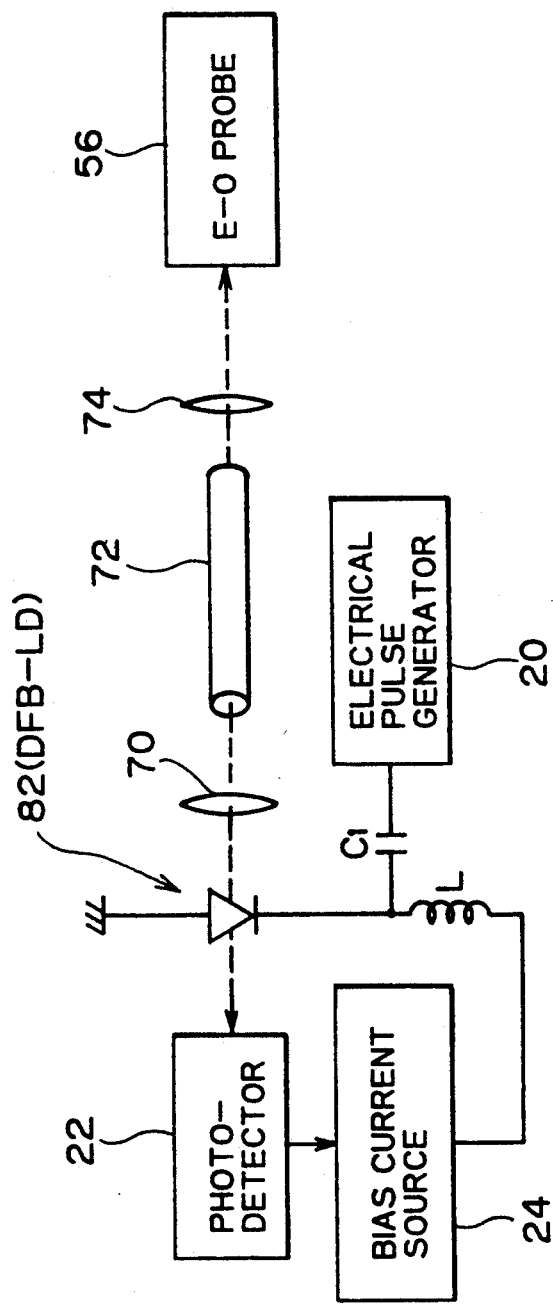
FIG. 13 is a block diagram of the voltage detection apparatus utilizing the light source including the chirp compensator as shown in FIG. 8(A) and a distributed feedback semiconductor laser(DFB-LD) used as a laser source.

FIGS. 12 and 13 show concrete arrangements of the light source for use in the voltage detection apparatus as described above.

In the light source as shown in FIG. 12, an optical fiber 72 as shown in FIG. 7(A) and a combination of a diffraction grating 76 and a slit 80 as shown in FIG. 8(B) are used as a chirp compensator and a wavelength selector, respectively, and a condensing lens 70 and a collimating lens 74 are provided between the semiconductor laser 10 and optical fiber 72 and between the optical fiber 74 and the diffraction grating 76, respectively.

As shown in FIG. 12, a train of optical pulses from the semiconductor laser 10 are converted into ultrashort optical pulses having a narrow spectral band width by the chirp compensator comprising the condensing lens 70, the optical fiber 72 and the collimator lens 74, and the wavelength selector comprising the diffraction grating 76, the reflection mirror 78 and the slit 80.

In place of the semiconductor laser 10 as shown in FIG. 12, a distributed feedback semiconductor laser (DFB-LD) 82 as shown in FIG. 13 may be used as a light source. Since an optical pulse emitted from the DFB-LD 82 inherently has a narrow spectral band width, and thus the light source of this embodiment requires no wavelength selector. Accordingly, the optical pulse from the DFB-LD 82 is passed through the condensing lens 70, the optical fiber 72 and the collimator lens 74 to the electrooptic probe 56.

In the above embodiments, the semiconductor laser is employed as a short-pulse light source. However, the short-pulse light source is not limited to the semiconductor laser, but may be another type of laser such as a gas laser, a solid-state laser, or the like.

According to the light source of the present invention, ultrashort optical pulses emitted from the short-pulse light source are controlled so as to be constant in intensity by the output stabilizer, so that the mode hopping and the wavelength shift due to temperature, for example, in a semiconductor laser are depressed. Moreover, the chirp compensator and the wavelength selector are effectively used to compensate a dispersion of the optical pulses which inherently occur in the light source and causes an spectral band width of the optical pulses to be broader, and to shorten the spectral band width of the optical pulses.

If the light source according to this invention is applied to an electrooptic voltage detection apparatus for an electrooptic sampling measurement, a time resolution is increased by shortened pulses, changes in the intensity of the output light of a light modulator are reduced by a narrow spectral band width, noise is lowered by the reduced changes in the intensity of the output light of the light modulator, and accurate measurements are made possible.

What is claimed is:

1. A voltage detection apparatus for optically detecting changes in a voltage which is being applied to an object, comprising:
   a light source comprising:
      a laser source for emitting a laser beam,
      a laser driving unit for driving said laser source, the laser driving unit including means for driving the laser source to output a pulsed laser beam and for stabilizing an intensity of the pulsed laser beam, and
      a spectral-band width narrowing unit for narrowing a spectral band width of the pulsed laser beam, said narrowing unit including means for performing chirp compensation and wavelength selected to convert the pulsed laser beam emitted from said laser source into a pulsed laser beam having an ultrashort pulse width and a desired narrow spectral band;
   a light modulator having an electrooptic characteristic for passing the pulsed laser beam from said spectral-band width narrowing unit therethrough, said light modulator adding information to said pulsed laser beam that represents an amount of change in the voltage applied to the object, said light modulator outputting the pulsed laser beam having the information representing said voltage change; and
   a photodetector for detecting the pulsed laser beam outputted from said light modulator to obtain the information representing the change in the voltage applied to the object.

2. A voltage detection apparatus as claimed in claim 1, wherein said spectral-band width narrowing unit comprises a chirp compensator for compensating chirp of input lights thereto and a wavelength selector for extracting light having a desired wavelength from input lights thereto.

3. A voltage detection apparatus as claimed in claim 2, wherein said chirp compensator receives the pulsed laser beam from the laser source to compensate chirp of the pulsed laser beam and outputs the chirp-compensated pulsed laser beam, wherein the wavelength selector receives the chirp-compensated pulsed laser beam from the chirp compensator to extract therefrom a part of the pulsed laser beam having a desired wavelength and outputs the extracted part of the chirp-compensated pulsed laser beam, and wherein said light modulator passes therethrough the extracted part of the chirp-compensated pulsed laser beam from the wavelength selector.

4. A voltage detection apparatus as claimed in claim 3, wherein the laser source carries out a multi-mode oscillation to emit the pulsed laser beam, and wherein said chirp compensator compensates chirp in each mode of the pulsed laser beam.

5. A voltage detection apparatus as claimed in claim 3, wherein said laser source carries out a multi-mode oscillation to emit the pulsed laser beam, and wherein said chirp compensator compensates chirp between the respective modes of the pulsed laser beam.

6. A voltage detection apparatus as claimed in claim 2, wherein the wavelength selector receives the pulsed laser beam from the laser source to extract therefrom a part of the pulsed laser beam having a desired wavelength and outputs the extracted part of the pulsed laser beam, wherein the chirp compensator receives the extracted part of the pulsed laser beam from the wavelength selector to compensate chirp of the extracted part of the pulsed laser beam and outputs the chirp-compensated part of the pulsed laser beam, and wherein said light modulator passes therethrough the chirp-compensated part of the pulsed laser beam from the chirp compensator.

7. A voltage detection apparatus as claimed in claim 2, wherein the chirp compensator comprises an optical fiber.

8. A voltage detection apparatus as claimed in claim 2, wherein the chirp compensator comprises at least one pair of prisms.

9. A voltage detection apparatus as claimed in claim 2, wherein the chirp compensator comprises at least one pair of diffraction gratings.

10. A voltage detection apparatus as claimed in claim 2, wherein the wavelength selector comprises a spectroscope.

11. A voltage detection apparatus as claimed in claim 2, wherein the wavelength selector comprises a diffraction grating and a slit.

12. A voltage detection apparatus as claimed in claim 2, wherein the wavelength selector comprises plural Fabry-Perot etalons having different plate-to-plate distances.

13. A voltage detection apparatus as claimed in claim 2, wherein the spectral-band width narrowing unit comprises two pairs of prisms and a slit sandwiched therebetween.

14. A voltage detection apparatus as claimed in claim 1, wherein the laser source comprises a semiconductor laser source, and wherein the laser driving unit comprises:
   an electrical pulse generator for generating a train of electrical pulses and for applying the train to the semiconductor laser source to enable the semiconductor laser source to carry out a pulse oscillation; and
   a bias current source for supplying the semiconductor laser source with a bias current sufficient to stabilize the intensity of the pulsed laser beam.

15. A voltage detection apparatus as claimed in claim 14, wherein the laser driving unit further comprises a photodetector, connected to said bias current source, for detecting the pulse laser beam outputted from the laser source and for outputting a signal indicative of the detected result, and wherein the bias current source adjusts the amount of bias current, in response to the signal, to stabilize the intensity of the pulsed laser beam.

16. A voltage detection apparatus as claimed in claim 1, wherein said light modulator comprises an electrooptic crystal.

17. A voltage detection apparatus as claimed in claim 1, wherein the laser driving unit comprises:
   driving means for driving the laser source to output a pulsed laser beam;
   detection means for detecting the pulsed laser beam outputted from the laser source and for outputting a signal indicative of the detected result; and
   control means for receiving the signal from the detection means and for controlling the laser source, in response to the signal, to thereby stabilize the intensity of the pulsed laser beam.

18. A voltage detection apparatus for optically detecting changes in a voltage which is being applied to an object, comprising:
   an optical source for emitting an optical pulse beam;
   chirp compensation means for receiving the optical pulse beam emitted from said optical source and for compensating chirp of the optical pulse beam to convert the optical pulse beam into an optical pulse beam having an ultrashort pulse width;
   an optical modulator having an electrooptic characteristic for passing therethrough the optical pulse beam from said chirp compensation means, said optical modulator adding information to said optical pulse beam that represents an amount of change in the voltage applied to the object, said optical modulator outputting the optical pulse beam having the information representing the voltage change; and
   a photodetector for detecting the optical pulse beam outputted from said optical modulator to obtain the information representing the change in the voltage applied to the object.

19. A voltage detection apparatus as claimed in claim 18, wherein said optical source comprises:
   a laser source for emitting a laser beam; and
   a laser driving unit for driving the laser source to emit a laser pulse beam.

20. A voltage detection apparatus as claimed in claim 18, further comprising:
   detection means for detecting the optical pulse beam emitted from said optical source and for outputting a signal indicative of the detected result; and
   feed-back control means for controlling said optical source, in response to the signal outputted from said detection means, to stabilize the intensity of the optical pulse beam.

21. A voltage detection apparatus as claimed in claim 20,
   wherein said optical source includes a semiconductor laser source for emitting the laser beam and a laser driving unit for driving the semiconductor laser source to emit a laser pulse beam,
   wherein the laser driving unit comprises a bias current source for supplying the semiconductor laser source with bias current and an electrical pulse generator for generating a train of electrical pulses and for applying the train to the semiconductor laser source to enable the semiconductor laser source to carry out a pulse oscillation, and
   wherein said feed-back control means controls the bias current source to supply the semiconductor laser source with a bias current sufficient to stabilize the intensity of the pulsed laser beam.

22. A voltage detection apparatus as claimed in claim 18, further comprising:
   wavelength selection means for receiving the optical pulse beam from said optical source and for extracting therefrom one part of the optical pulse beam having desired wavelength, wherein said chirp compensation means receives the extracted part of the optical pulse beam from said wavelength selection means and compensates chirp of the extracted part of the optical pulse beam, and wherein said optical modulator passes therethrough the chirp-compensated part of the optical pulse beam from said chirp compensation mans.

23. A voltage detection apparatus as claimed in claim 22, further comprising:
   detecting means for detecting the extracted part of the optical pulse beam outputted from said wavelength selection means and for outputting a signal indicative of the detected result; and
   feed-back control means for controlling said optical source in response to the signal outputted from said detection means to stabilize the intensity of the part of the optical pulse beam having the desired wavelength.

24. A voltage detection apparatus as claimed in claim 23,
   wherein said optical source includes a semiconductor laser source for emitting the laser beam and laser driving unit for driving the semiconductor laser source to emit a laser pulse beam, wherein the laser driving unit comprises a bias current source for supplying the semiconductor laser source with bias current and an electrical pulse generator for generating a train of electrical pulses and for applying the train to the semiconductor laser source to enable the semiconductor laser source to carry out a pulse oscillation, and wherein said feed-back control means controls the bias current source to supply the semiconductor laser source with a bias current sufficient to stabilize the intensity of the pulsed laser beam.

* * * * *